Figure 1:
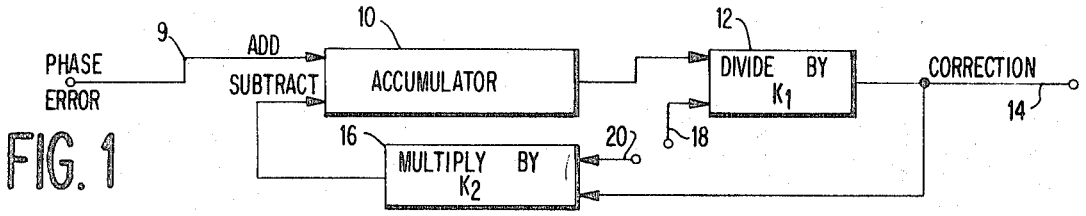
Figure 2:
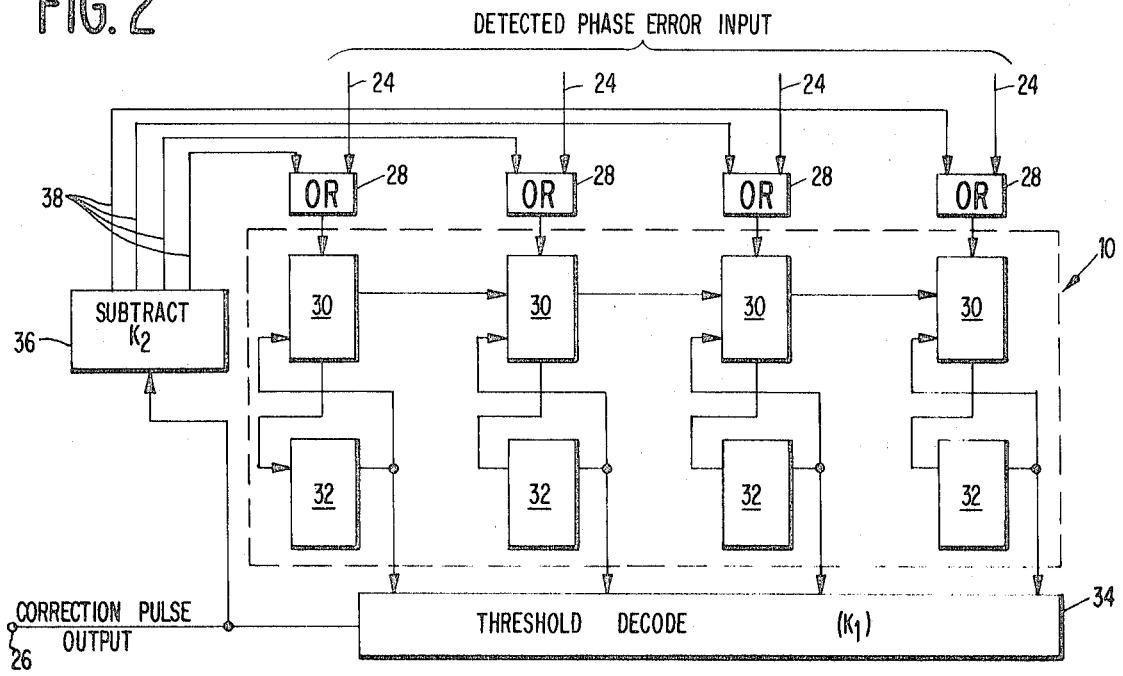
Figure 3:
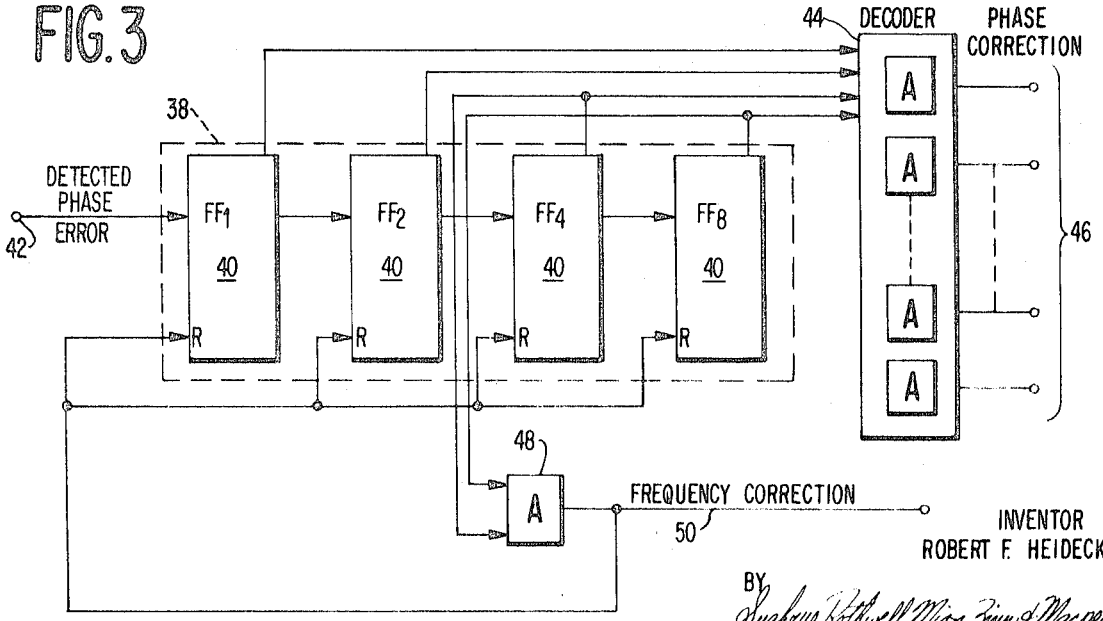

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED NOVEMBER 23, 1971

892 O.G. 1211

T892,009

DIGITAL PHASE SCALER

Robert F. Heidecker, Longmont, Colo., assignor to International Business Machines Corporation, Armonk, N.Y.

Continuation of application Ser. No. 792,232, Jan. 15, 1969. This application Dec. 2, 1970, Ser. No. 94,558

Int. Cl. G06f *7/48*

U.S. Cl. 235—156

1 Sheet Drawing. 11 Pages Specification

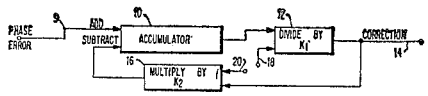

A digital phase scaler for weighting the detected phase error between input and output signals in an all digital phase lock loop so that the proper phase and frequency corrections are initiated. The scaler is a digital logic circuit which accumulates the phase errors and decodes a phase correction pulse at a controlled value of the accumulated phase errors. The scaler may also decode a frequency correction pulse at a controlled value of accumulated phase errors. Control points are included to vary the weighting function of the scaler and, hence, the response of the phase lock loop. The scaler is implemented in two basic designs: a binary adder-type scaler, and a binary counter-type scaler.

Nov. 23, 1971 R. F. HEIDECKER T892,009

DIGITAL PHASE SCALER

Filed Dec. 2, 1970

INVENTOR
ROBERT F. HEIDECKER

BY Sughrue, Rothwell, Mion, Zinn & Macpeak
ATTORNEYS